(12) United States Patent
Farrar

(10) Patent No.: US 6,432,844 B1
(45) Date of Patent: Aug. 13, 2002

(54) IMPLANTED CONDUCTOR AND METHODS OF MAKING

(75) Inventor: Paul A. Farrar, South Burlington, VT (US)

(73) Assignee: Micron Technology, Inc., Boise, ID (US)

(*) Notice: Subject to any disclaimer, the term of this patent is extended or adjusted under 35 U.S.C. 154(b) by 0 days.

(21) Appl. No.: 09/481,074

(22) Filed: Jan. 11, 2000

Related U.S. Application Data

(63) Continuation of application No. 08/829,851, filed on Apr. 1, 1997, now Pat. No. 6,017,829.

(51) Int. Cl.⁷ .............................................. H01L 21/31
(52) U.S. Cl. ...................... 438/783; 438/618; 438/781; 438/917; 257/325; 257/520; 257/609; 257/610; 257/643
(58) Field of Search ................................ 438/783, 618, 438/514, 527, 479, 666, 528, 523, 623, 537, 404, 434, 449, 450, 451, 510, 517, 522, 530, 541, 551, 558, 563, 761, 762, 766, 778, 781, 785, 917; 257/410, 288, 325, 347, 510, 519, 520, 609, 610, 612, 643, 646, 759, 761, 763, 774, 775, 796; 359/589, 570, 577

(56) References Cited

U.S. PATENT DOCUMENTS

| | | | | |
|---|---|---|---|---|
| 4,088,799 A | * | 5/1978 | Kurtin | 427/38 |
| 4,843,034 A | * | 6/1989 | Herndon et al. | 438/622 |
| 4,906,591 A | | 3/1990 | Okumura | 437/189 |
| 5,087,589 A | * | 2/1992 | Chapman et al. | 438/467 |
| 5,232,863 A | | 8/1993 | Roberts | 437/40 |
| 5,317,197 A | | 5/1994 | Roberts | 257/401 |
| 5,726,805 A | | 3/1998 | Kaushik et al. | 359/589 |
| 5,883,000 A | * | 3/1999 | Pasch | 438/618 |

FOREIGN PATENT DOCUMENTS

JP  02-287594  6/1992

* cited by examiner

Primary Examiner—Wael Fahmy, Jr.
Assistant Examiner—Julio J. Maldonado
(74) Attorney, Agent, or Firm—Workman, Nydegger & Seeley

(57) ABSTRACT

The present invention is directed toward the formation of implanted thermally and electrically conductive structures in a dielectric. An electrically conductive structure, such as an interconnect is formed through ion implantation into several levels within a dielectric layer to penetrate into an electrically conductive region beneath the dielectric layer, such as a semiconductor substrate. Ion implantation continues in discreet, overlapping implantations of the ions from the electrical conductive region up to the top of the dielectric layer so as to form a continuous interconnect. Structural qualities achieved by the method of the present invention include a low interconnect-conductive region resistivity and a low thermal-cycle stress between the interconnect and the dielectric layer in which the interconnect has been implanted. Implantation elements are selected in connection with dielectric materials so that heat treatment will cause continuous metallic structures to form within the interconnect implantation area. In an alternative embodiment, implantation dosages and depths are selected to form a thermally conductive structure that is entirely insulated within the dielectric layer and that function as a conduit to heat-sink structures.

37 Claims, 5 Drawing Sheets

IMPLANTED CONDUCTOR AND METHODS OF MAKING

1. Related Applications

This application is a continuation of U.S. patent application Ser. No. 08/829,851, filed on Apr. 1, 1997, now U.S. Pat. No. 6,017,829 titled Implanted Conductor and Methods of Making, which is incorporated herein by reference.

BACKGROUND OF THE INVENTION

2. The Field of the Invention

The present invention comprises a conductor forming process in which ion implantation forms an electrically conductive interconnect within a dielectric layer. The inventive conduct forming process also uses implantation to form a thermally conductive structure that is insulated by and contained within the dielectric layer.

3. The Relevant Technology

In the microelectronics industry, a substrate refers to one or more semiconductor layers or structures which includes active or operable portions of semiconductor devices. A substrate assembly refers to a substrate with one or more layers or structures formed thereon. For example, a substrate assembly in the present disclosure can refer to a substrate with interconnects that connect to active areas within the substrate. The interconnects can be within an insulative layer upon the substrate assembly. A semiconductor device can refer to a substrate assembly upon which at least one microelectronic device has been or is being fabricated. The semiconductor device can also refer to a semiconductor substrate assembly having formed thereon elements such as transistors. Interconnection layers are formed on the semiconductor substrate assembly for electrically connecting such elements.

The semiconductor industry has, since the development of the integrated circuit. used a process that required the etching of a hole or via in a dielectric layer and the subsequent filling of the hole with a conductive material to make a connection between one conductive layer and another. The connection was formed of such materials as polysilicon, high melting-point metals, high melting-point metal silicides, aluminum, and aluminum alloys. The ever-increasing pressure to miniaturize and to increase semiconductor device speed has required that both interconnect size and interconnect resistance be reduced. Therefore, semiconductor integrated circuit devices require interconnect structures of smaller lateral dimensions, and require materials that have smaller resistivities. A reliability problem in conventional etched via structures is over etching the via and undercutting a structure with which contact is to be made.

Because hole filling following an etch is problematic, interconnect hole filling seldom achieves a complete connection between the interconnect interface and the electrically conductive region beneath the interconnect. Attempts have been made to create interconnects by forming an interconnect first, followed by forming a dielectric layer, for example, by filling the regions between interconnects with a gelatinous material and curing the material into a solid dielectric. Thus, hole filling is avoided, however, there remains a discrete interface between the interconnect and the electrically conductive region that the interconnect contacts.

Additionally, as semiconductor device dimensions continue to shrink in size the problem of heat management continues to increase in complexity. As heat management requirements continue to increase, methods of removing heat from the semiconductor device without increasing the vertical or lateral geometries of the devices are constantly being sought.

What is needed is a method of forming an interconnect without the prior art via etching and via hole-filling process. What is also needed is a method of forming an interconnect wherein the interconnect minimizes interface discontinuities between the electrically-conductive region beneath the interconnect and the interconnect itself. What is also needed is a method of forming an interconnect that resists thermal cycle stresses at the interface with the dielectric material and with the electrically conductive region beneath the interconnect. What is also needed is a method of forming heat management structures within semiconductor devices without increasing the vertical or lateral geometries of the devices.

SUMMARY OF THE INVENTION

The present invention is directed toward the formation of an interconnect that is not within an etched via. Interconnect formation is accomplished through ion implantation into several levels within a dielectric layer. Ion implantation penetrates into an electrically conductive region beneath the dielectric layer and continues in discreet, overlapping implantations up to the top of the dielectric layer, thus forming a continuous interconnect.

Structural qualities achieved by the method of the present invention include a low resistivity between the interconnect and the conductive region. There is also a low thermal-cycle stress between the interconnect and the dielectric layer in which the interconnect has been implanted, and between the interconnect and the electrically conductive region beneath the interconnect.

Implantation elements may be selected in connection with dielectric materials so that heat treatment will cause continuous metallic structures to form within the interconnect implantation area by dissociation of metallic elements from the dielectric material and the combination of these dissociated elements with the implanted metal ions.

The present invention is also directed toward the implantation of ion dosages and depths that are selected so as to form heat-management structures that are entirely insulated within the dielectric layer. Heat-management structures of the present invention have coefficients of thermal conductivity that are greater than the coefficients of thermal conductivity of the preferred dielectric materials. Implantation can also simultaneously form semiconductor active areas with interconnect formation by the implantation methods of the present invention.

These and other features of the present invention will become more fully apparent from the following description and appended claims, or may be learned by the practice of the invention as set forth hereinafter.

BRIEF DESCRIPTION OF THE DRAWINGS

In order that the manner in which the above-recited and other advantages of the invention are obtained, a more particular description of the invention briefly described above will be rendered by reference to specific embodiments thereof which are illustrated in the appended drawings. Understanding that these drawings depict only typical embodiments of the invention and are not therefore to be considered to be limiting of its scope, the invention will be described and explained with additional specificity and detail through the use of the accompanying drawings in which.

DETAILED DESCRIPTION OF THE PREFERRED EMBODIMENTS

The present invention is directed toward methods of forming an implanted interconnect and a structure for conducting thermal energy away from semiconductor devices. Disclosed is a method that does not require etching of a dielectric layer in the region that normally is removed in order to form a via, which is then filled with a conductive material to form the interconnect. Rather, the present method uses a succession of ion implants to produce an electrically or thermally conductive structure in sections of a dielectric layer where desired. The present invention is applicable to integrated semiconductor circuits, as well as in other applications where a connection is needed between two structures which will be separated by a dielectric layer.

Figure 1:
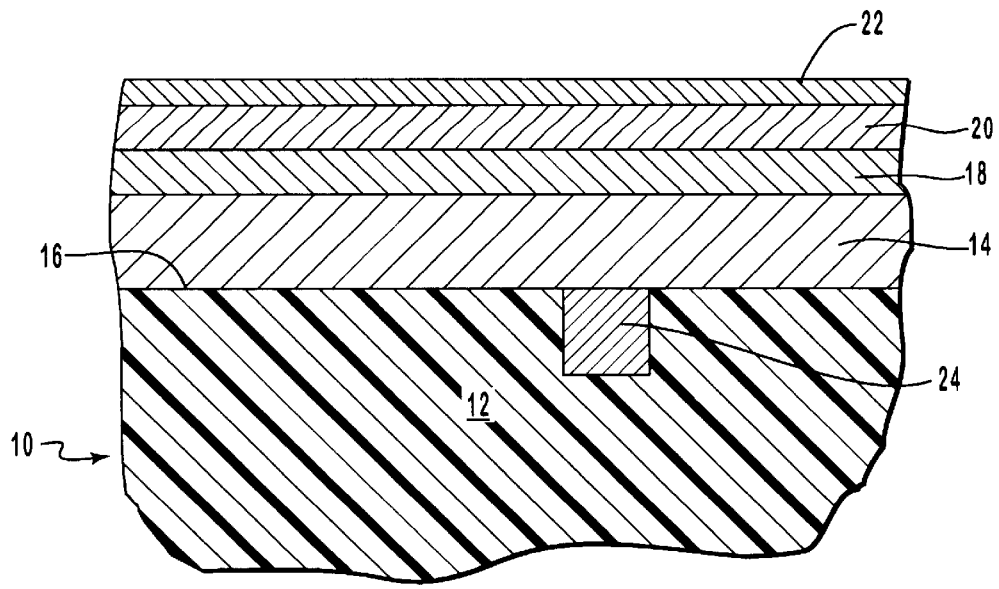
FIG. 1 is a cross-sectional elevation view illustrating a region of a semiconductor device into which conductive structures of the present invention are to be implanted.

FIG. 1 illustrates a first embodiment of the present invention in which a semiconductor device 10 comprising a substrate 12 has a dielectric layer 14 disposed upon an upper surface 16. Preferred materials for dielectric material 14 include commercial polyimides.

Examples of polyimides include pyromellitic dianhydride (PMDA) and oxydianiline (ODA, also named 4,4'-diaminodiphenyl ether). Other preferred polymers for use pursuant to the present invention are the polymers of benzophenonetetracarboxylic dianhydride (BTDA) and ODA and/or 1,3-phenylenediamine and the polymer of 3,3'-biphenylenetetracarboxylic acid (BPDA) and 1,4-phenylenediamice (PDA). Polyimide films based on PMDA-ODA are available from Allied Corporation under the tradename Apical® and from Du Pont under the tradename Kapton®. Films based on BPDA-PDA are available from Ube Corporation as Upilex® and from Hitachi Chemical Company as PIQ-L100. Other tradename polyimides useful pursuant to the present invention include Durimid® from Rogers Corporation and the Du Pont Pyralin® series, including PI-2525 and PI-2566. In combination, preferred dielectric polymers include BPDA-PDA, BPDA-ODA, BTDA-ODA, BTDA-PDA, PMDA-PDA, and PMDA-ODA.

Other perferred dielectrics include, borophosphosilicate glass (BPSG), borosilicate glass (BSG), phosphosilicate glass (PSG), silica, thoria, ceria, zirconia, and organometallic compounds.

First, second, and third mask layers 18, 20, 22 are disposed upon dielectric layer 14. An electrically conductive region 24 may be imbedded in upper surface 16 of substrate 12, or electrically conductive region 24 may be formed by the methods of the present invention. Region 24 can be a conductive line such as metallization formed of polysilicon, or it can be an active region substantially composed of doped silicon.

Figure 2:
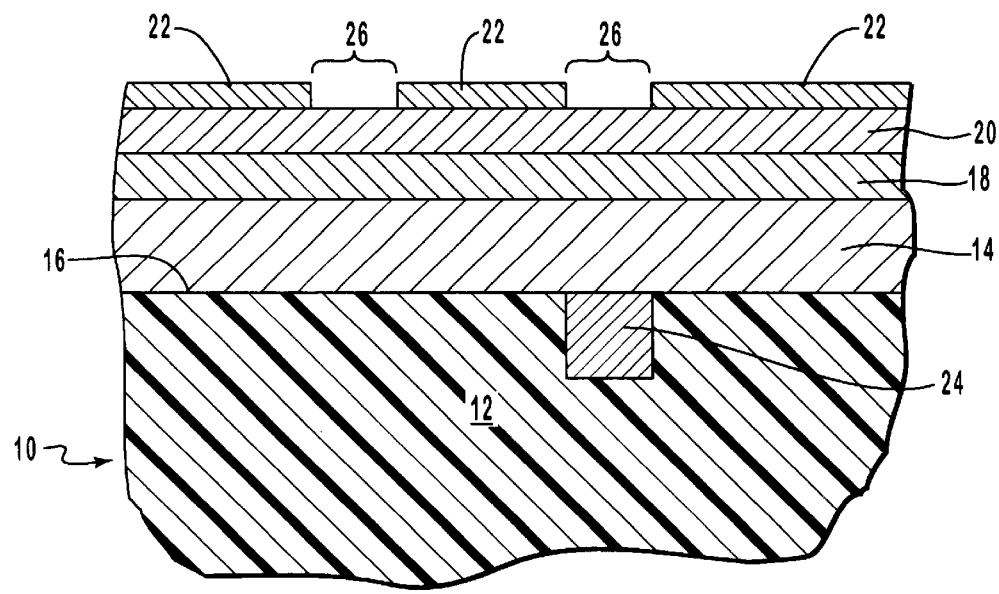
FIGS. 2, 3, and 4 are cross-sectional elevation views illustrating progressive process steps of forming the implanted conductive structures of the present invention.
Figure 3:
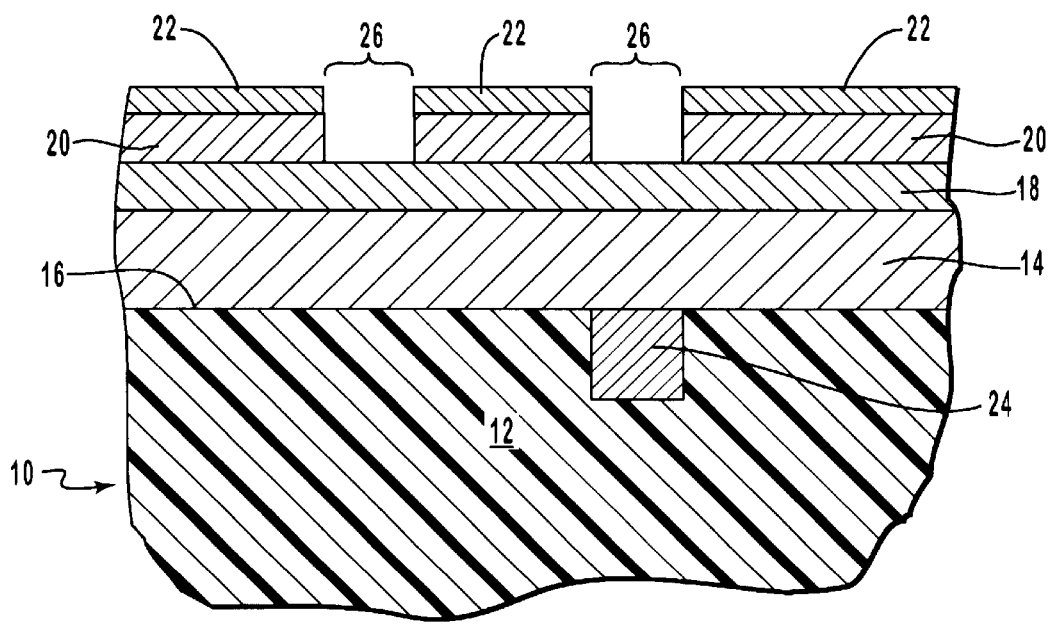
Figure 4:
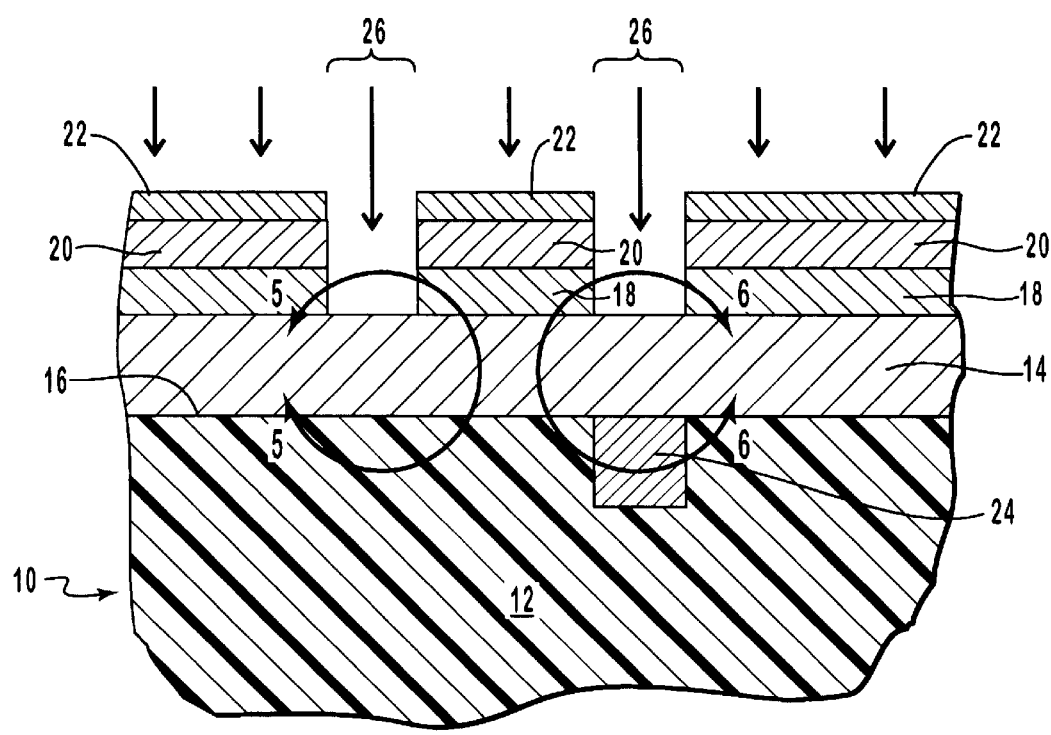

FIGS. 2, 3, and 4 progressively illustrate an example of the method of the present invention of etching through first, second, and third mask layers 18, 20, 22, and the ion implanting of electrically conductive material therethrough to form interconnects. In FIG. 2 an etch has been conducted in which etch holes 26 are formed in third mask layer 22. In FIG. 3 an etch continues to form etch holes 26 in second mask layer 20. In FIG. 4 an etch has formed an etch hole in first mask 18 layer.

Ion implantation is illustrated in FIG. 4 with downwardly vertical arrows. Ions implant within etch holes 26 into dielectric layer 14. Etch holes 26 may be, but need not be, above an electrically conductive region 24 within substrate 12. The step of ion implantation may serve as both a doping step in forming an electrically conductive region in substrate 12, and as an interconnect-forming implantation step of the present invention. In this simultaneous doping and interconnect-forming method alternative, an extra process step is avoided for active region doping. The advantage of the method is that it forms an electrically conductive region 24, a doped active area in this example, that is inherently aligned with the implanted interconnect.

Figure 5:
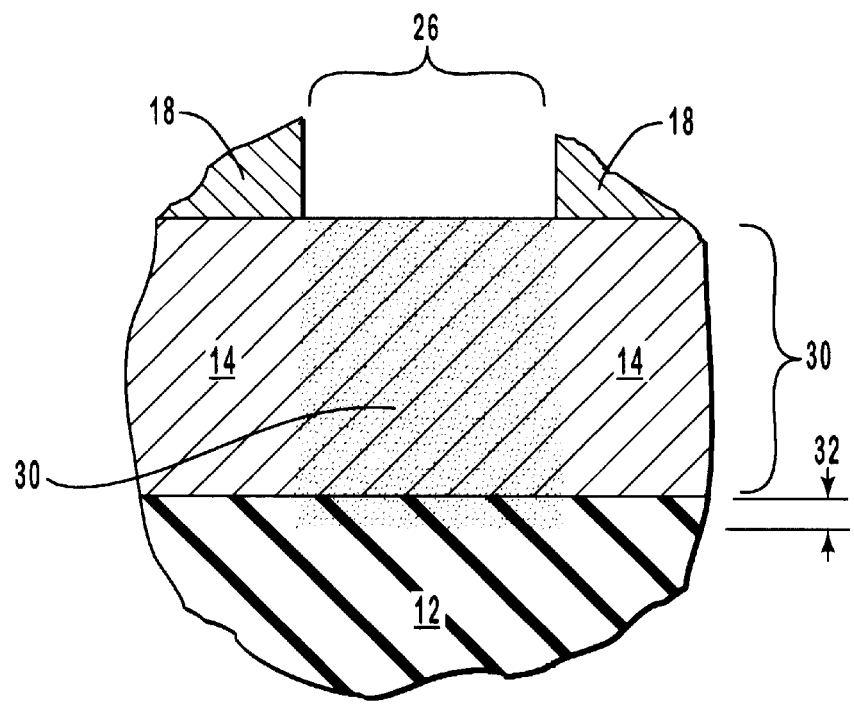
FIG. 5 is a cross-sectional elevation view taken along the 5—5 section line in FIG. 4, and illustrates the result of ion-implantation wherein ions have been implanted within a dielectric layer with a portion of the implanted ions overlapping into an underlying substrate.

FIG. 5 illustrates the result of ion-implantation within the section-line 5—5 in FIG. 4. In FIG. 5 an implanted interconnect 30 is illustrated wherein ions have been implanted within dielectric layer 14. A portion of implanted interconnect 30 overlaps into substrate 12. The overlap portion is an implanted an overlap depth 32 that minimizes the electrical resistance interface and the thermal stress interface between interconnect 30 and electrically conductive region 24 if it is present. Preferably, implanted interconnect 30 will have a length in a range from about 1,000 Å to about 30,000 Å.

Formation of an active area simultaneously with formation of an interconnect makes the active area and the interconnect self-aligned. If substrate 12 is not doped, doping of substrate 12 can occur simultaneously with forming an interconnect in the region within and below etch hole 26. For example if substrate 12 is monocrystalline silicon, n-doping or p-doping can be performed by implanting selected ions. The ions that are implanted within substrate 12 will make that portion of substrate 12 into electrically conductive region 24. For example, aluminum ions produce n-doping in a monocrystalline silicon substrate, and subsequent aluminum ion implantation, or another selected metal ion, will form implanted interconnect 30.

Although substrate 12 is usually made of monocrystalline silicon, other substrates can be provided and doped simultaneously with formation of implanted interconnect 30. By way of example, semiconductors are fabricated from compounds made by a combination of elements from periodic table groups IA-VIIA, IIA-VIA, and IIIA-VA, as well as IA-IIIA-VI$_2$A, and IIA-IVA-V$_2$.

Implanted overlap depth 32 expands laterally upon heat treatment of device 10 to form, for example, an active area in a transistor source-drain structure.

Dielectric layer 14 can be selected to be an organometallic dielectric or equivalent that releases metal elements in favor of bonding with oxygens or nitrogens and equivalents.

Treatment is carried out in an oxygen or nitrogen atmosphere following implantation. Implantation of metal ions to form implanted interconnect 30 or an implanted thermal conductor will, either spontaneously or with heat treatment, cause the metals in the organometallic dielectric to combine with the implanted metal ions to form a substantially coherent and continuous metal interconnect.

Combination of the metals in the organometallic and the implanted species accomplishes more metallization in the implanted interconnect 30 or in an implanted thermal conductor than simple implantation alone achieves. Combination also renders the organometallic dielectric that remains more resistant to electrical conductivity than regions not implanted with metal ions.

An alternative to an organometallic dielectric that releases its metal element in favor of oxides or nitrides, is an organometallic that releases its metal element by catalysis caused by the presence of the implanted metal species. By this optional method, the regions of dielectric not implanted by the metal ions, do not become conductive at the temperatures at which the catalytic reaction occurs.

Figure 6:
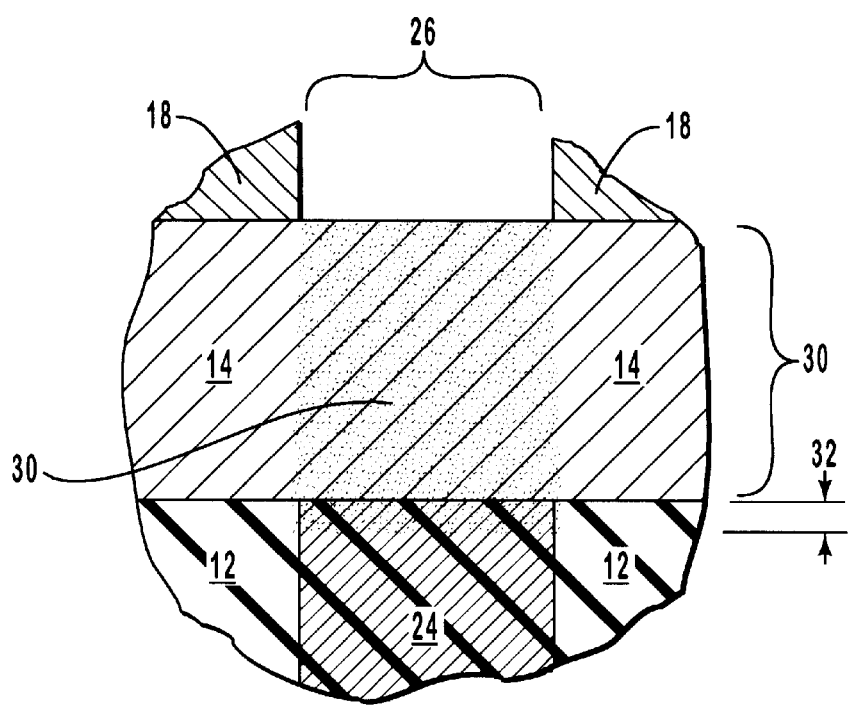
FIG. 6 is a cross-sectional elevation view taken along the 6—6 section line in FIG. 4, and illustrates ions having been implanted within the dielectric layer to contact an active area in the underlying substrate.

FIG. 6 illustrates electrically conductive region 24 that is imbedded within substrate 12. Ion implantation into dielectric layer 14 is illustrated as implanted interconnect 30, extending to implanted overlap depth 32. Overlap depth 32 can be optimized so as to minimize the electrical resistance interface and the thermal stress interface between interconnect 30 and electrically conductive region 24. Implanted overlap depth 32 and implanted interconnect 30 form a substantially continuous electrically conductive interface between substrate 12 and implanted interconnect 30. The advantage of a substantially continuous electrical interface between an interconnect and an electrically conductive region is that both resistivity and thermal stresses are ameliorated for field use of the semiconductor device.

Figure 7:
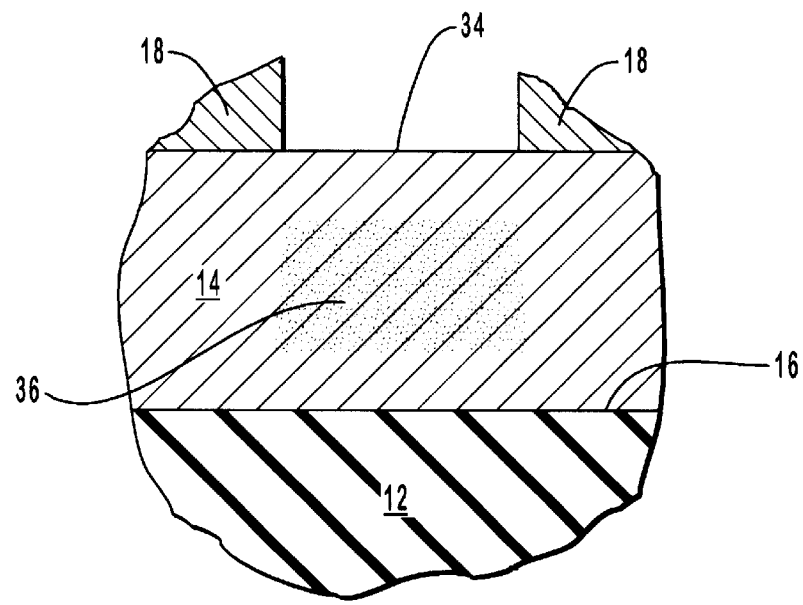
FIG. 7 is a cross-sectional elevation view taken along the 5—5 section line in FIG. 4, and illustrates ions having been implanted wholly within the dielectric layer.

FIG. 7 illustrates ion-implantation resulting in an implanted thermal conductor 36 that is formed entirely within dielectric layer 14. As such, there is no overlap into substrate 12, and no portion of the implanted contacts upper surface 34 of dielectric layer 14. Where no electrically conductive region 24 lies beneath etch hole 26, ion implantation may form a lateral interconnect to an implanted thermal conductor 30. Dielectric layer 14 continues to serve as an electrical insulator and implanted thermal conductor 36 serves as a thermal conductor where the coefficient of thermal conductivity of conductor 36 is greater than the coefficient of thermal conductivity of dielectric layer 14. Implanted thermal conductor 36 serves as a collector for Joule heat and a conduit for channeling heat therein, and acts as a heat sink.

Figure 8:
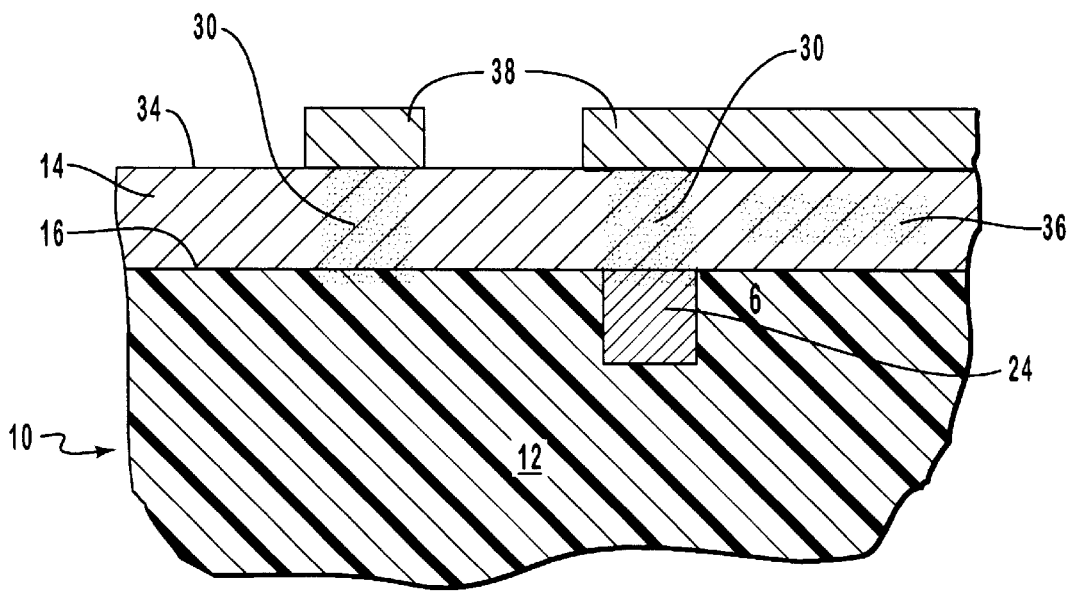
FIG. 8 is a cross-sectional elevation view illustrating embodiments of the conductive structures of the present invention which are seen FIGS. 5–7.

FIG. 8 is an illustration of semiconductor device 10 with three (3) features of the present invention illustrated therein. Two implanted interconnects 30 are illustrated wherein implantation has occurred in a first instance above electrically conductive region 24, and in a second instance above substrate 12 with no electrically conductive region thereunder. Implanted thermal conductor 36 is also illustrated in FIG. 8 wherein no electrical connection is made to substrate 12. Metallization lines 38 have been formed upon upper surface 34 of dielectric layer 14. Implanted interconnects 30 form interconnects from to metallization lines 38 to electrically conductive region 24 and to substrate 12. Implanted thermal conductor 36 lies beneath metallization lines 38 and serves as an excess Joule heat collector for metallization lines 38.

Preferred ions to form the implanted interconnect are chosen to be compatible with the structure in which it is used. In an integrated circuit, implantation of copper or gold in areas where these elements might migrate into the substrate could cause field failure and affect carrier lifetime. In other applications, copper or gold would be acceptable materials to use. In a semiconductor application, elements such as Al, Ni, Cr, Mo, Ta, W, Ti, Zr, Hf, or V and equivalents might be chosen. In some applications in which a preferred dielectric layer material is used, Ni would be a preferred element because of its resistance to oxidation and its relatively good electrical conductivity. In some applications in which a preferred dielectric layer material is used, Al would be a preferred element because it can be implanted into a dielectric that will not substantially oxidize it and because of aluminum's relatively good electrical conductivity.

Materials that will form the implanted interconnect or thermally conductive implants are selected so that when the total implant dose is integrated over any segment, the total amount of implant meets or exceeds the desired concentration. In an example of a 10,000 Å film the first implant dose is selected so that at least 4 percent of the implant dose penetrates the entire 10,000 Å film, and that at least 10 percent of the implant dose is deposited in the 500 Å slice between 9,500 Å and 10,000 Å. The percentage of the implant dose is then calculated for each succeeding slice of 500 Å in which any appreciable amount of the implant dose is absorbed. The dose of the implant is then calculated to produce a concentration that exceeds the desired minimum in the first slice. The percentage is then multiplied by the dose amount and divided by the nominal Si concentration of about $5 \times 10^{22}$ atoms/cm$^3$ to obtain the percent of the implanted species in each slice. The second and succeeding implants are determined in a like manner until an implanted interconnect or an implanted thermal conductor is formed as desired.

Figure 9:
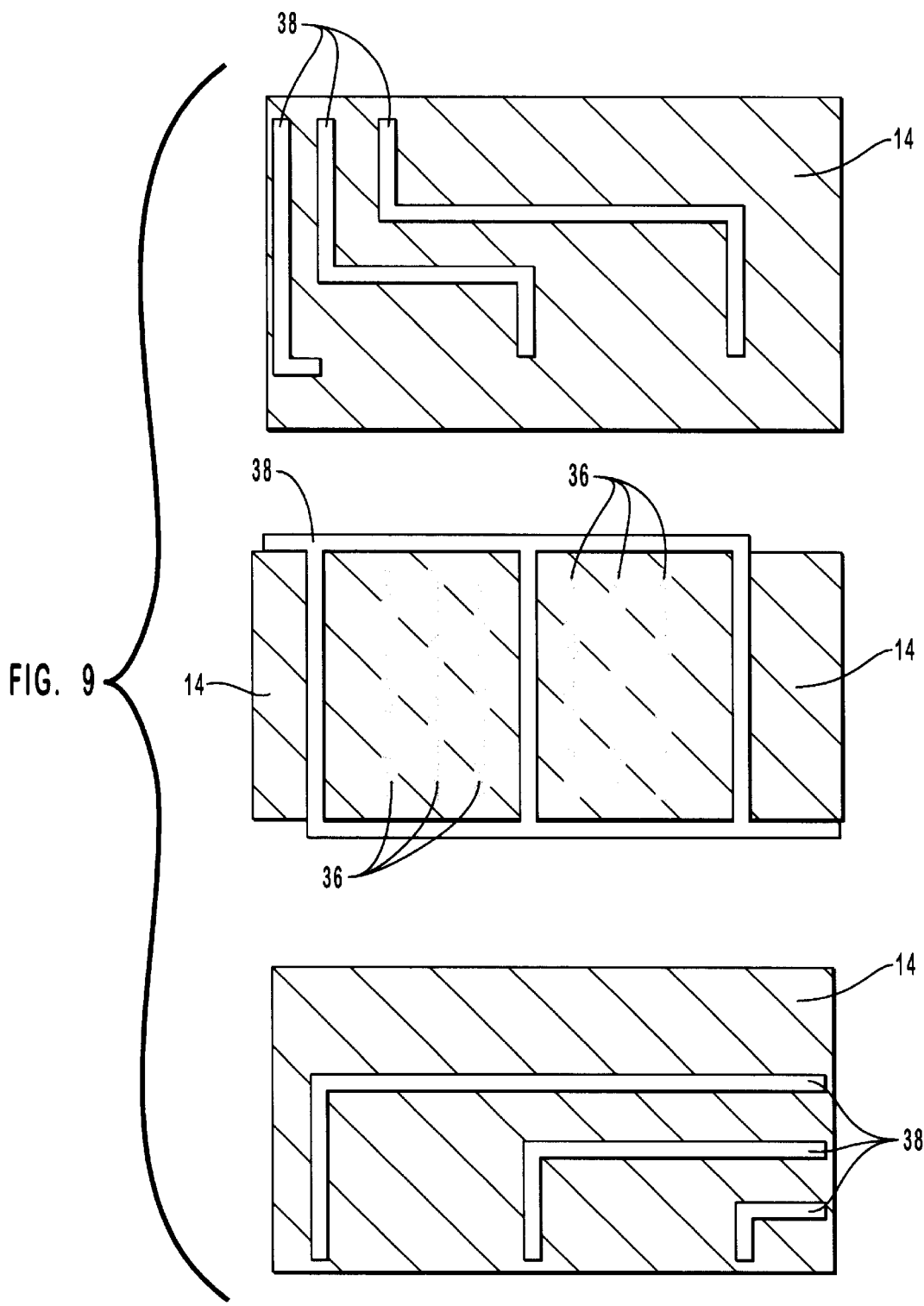
FIG. 9 shows top, cross-sectional, and bottom views of metallization lines upon a dielectric layer having therein implanted thermal conductors for thermally conducting heat away from the metallization lines according to the present invention.

FIG. 9 illustrates top, cross-sectional, and bottom views of metallization lines 38 and implanted thermal conductor 36. Implanted thermal conductor 36 is designed to conduct heat away from metallization lines 38 or away from another functional element within a semiconductor device that generates Joule heat during field operation. Implanted thermal conductor 36 is electrically isolated from metallization lines 38 by dielectric layer 14. Implanted thermal conductor 36 is situated proximal to metallization lines 38 such that heat generated in metallization lines 38 is conducted through dielectric layer 14 into implanted thermal conductor 36. Implanted thermal conductor 36 may serve, for example, as a channel that leads to a heat sink structure.

The implanted electrically conductive structure formed in the inventive process will have a width in a range from about 0.3 Å to about 0.49 Å, and the dielectric layer will have a thickness from about 2,000 Å to about 12,000 Å. More preferably, where the dielectric layer has a thickness range of from about 8,000 Å to about 12,000 Å, the implanted electrically conductive structure will have a width range of from about 0.39 Å to about 0.49 Å. Where the dielectric layer has a thickness range of from about 4,000 Å to about 6,000 Å, the implanted electrically conductive structure will have a width range of from about 0.33 Å to about 0.43 Å. Where the dielectric layer has a thickness range of from about 2,000 Å to about 3,000 Å, the implanted electrically conductive structure will have a width range of from about 0.30 Å to about 0.40 Å.

The following process is an example used to produce a no via-etch interconnect in a layer polyamide having a thickness of 10,000 Å, which is seen in the Figures as dielectric layer 14. An appropriate mask is first put in place. This can be either a simple mask, a multiple-layer mask, or a stand-off mask covered by a thin metal or inorganic layer. The mask is then covered with an imaging resist layer. In any case, the mask must be thick enough to stop essentially all of the incoming implant species. The mask is then imaged to produce openings through which a series of implantations of the implant species are then performed.

If an electrical contact is desired, the energy of the implantation is chosen so that penetration of the implant species is substantially continuous through dielectric layer 14 to substrate 12. The energy of the implantation and the range of the depth of penetration of each implanted level can be calculated using, for example, a Monte Carlo simulation of the scatter and subsequent distribution of each of the required implant levels.

Calculations are given below in Table 1 for the formation of an implanted conductor in a dielectric layer having a thickness of about 10,000 Å and being substantially composed of BPDA-ODA or PMDA-ODA. The implanted conductor is formed, as shown in the Figures, by applying first mask 18 as a 5,000 Å thick positive photo resist. Second mask 20 is applied as a 5,000 Å thick $Si_3N_4$ layer. Third mask 22 is applied as a 2,000 Å top imaging photo resist. Masks 18, 20, 22 are exposed and patterned to form a mask that will facilitate ion implantation to form implanted interconnects 30. Implantation of Ni is then carried out. The remaining portions of masks 18, 20, and 22 serve to mask out unwanted ion implantation. Table 1 illustrates eight (8) implantation steps of this example embodiment.

TABLE 1

| Implant # | Implant Energy | Implant dose | |
|---|---|---|---|
| 1 | 825 KEV | 1.35 | $10^{18}$ |
| 2 | 410 KEV | 8.98 | $10^{17}$ |
| 3 | 175 KEV | 3.2 | $10^{17}$ |
| 4 | 70 KEV | 1.3 | $10^{17}$ |
| 5 | 20 KEV | 7.0 | $10^{16}$ |
| 6 | 5 KEV | 1.6 | $10^{16}$ |
| 7 | 900 V | 1.3 | $10^{16}$ |
| 8 | 80 V | 4.0 | $10^{16}$ |

Illustration of the method of the present example continues by removing all masks and the metallizing the structure with appropriate electrically conductive materials such as is illustrated in FIG. 8 as metallization lines 38. Following connection of implanted interconnects 30 to metallization lines 38, additional layers may then be built upon the present structure, such as by depositing a second dielectric layer (not shown) and continuing to build up the device.

Implant dose and energy are a function of the qualities of both the dielectric layer and the implanted species. Variation of the type of material of the dielectric layer and the implanted species to achieve a desired structure are contemplated. Table 2 illustrates the result of a Ni implant in the inventive example.

TABLE 2

| Distance from Upper Surface of Dielectric Layer (Å) | Ni. Percent |
|---|---|
| 0–20 | 42 |
| 20–50 | 73 |
| 50–100 | 37 |
| 100–150 | 42 |
| 150–200 | 46 |
| 200–300 | 72 |

TABLE 2-continued

| Distance from Upper Surface of Dielectric Layer (Å) | Ni. Percent |
|---|---|
| 300–400 | 45 |
| 400–600 | 33 |
| 600–800 | 51 |
| 800–1000 | 47 |
| 1000–1250 | 33 |
| 1250–1500 | 44 |
| 1500–1750 | 53 |
| 1750–2000 | 56 |
| 2000–2500 | 43 |
| 2500–3000 | 33 |
| 3000–3500 | 38 |
| 3500–4000 | 86 |
| 4000–4500 | 95 |
| 4500–5000 | 66 |
| 5000–5500 | 36 |
| 5500–6000 | 41 |
| 6000–6500 | 31 |
| 6500–7000 | 40 |
| 7000–7500 | 48 |
| 7500–8000 | 67 |
| 8000–8500 | 86 |
| 8500–9000 | 68 |
| 9000–9500 | 49 |
| 9500–10000 | 66 |

As can be seen in Table 2, the minimum Ni concentration in any segment of 500 Å or less is at least 31 percent. Embodiments of this invention comprise implanting ions into the dielectric material to form an electrically conductive structure in the dielectric material, and the implanting further comprises a series of implants of the ions to implant them in a series of overlapping implantation depths, and each series of ion implants comprises an ion concentration greater than about 30% of a region into which each series was implanted. A preferred random distribution of metal atoms is a range from about 35 percent to about 40 percent metal provides enough electrically conductive material to give sufficient contact, whereas more than about four percent and less than about 10 percent is preferably in a segregated mixture. Depending upon the nature of the implant, some segregation will occur. Embodiments of this invention comprise implanting ions into the dielectric material to form an electrically conductive structure in the dielectric material, and the implanting further comprises a series of implants of the ions to implant them in a series of overlapping implantation depths, and each series of overlapping implantation depths overlaps in a range from about 0% to about 10% of the respective implantation dose both below and above each series of overlapping implantation depths.

It may be desirable to anneal an implanted conducive structure to distribute the implanted species. Anneal conditions are chosen so that diffusion takes place in the implanted columns but no significant atom diffusion occurs between adjacent implanted areas. As implant damage occurs in areas of implantation, local diffusion rates in these areas will be enhanced.

In cases where an implanted conductive structure segregates during anneal into grain or sub-grain boundaries of the dielectric layer, a reduced amount of implant is required to give adequate electrical interconnect qualities. When the dielectric layer is a polymer, as in the above-given example, the heat treatment is preferably in a range from about 300 to about 500 degrees centigrade, and more preferably about 400 degree centigrade. In the case of the above-given example, curing of the polyamide dielectric layer provides required heat for annealing of the implanted conductive structure.

Heat treatment following implantation can be beneficial. For instance, an implanted conductive structure with in a dielectric layer that overlaps into a semiconductor substrate will expand laterally upon heat treatment to form, for example, an active area associated with a transistor source-drain structure.

Dielectric layer 14, seen in the Figures, can be selected to be an organometallic dielectric or equivalent that releases metal elements in favor of bonding with oxygens or nitrogens and equivalents. Treatment is carried out in an oxygen or nitrogen atmosphere following implantation. Implantation of metal ions to form implanted interconnect 30 or an implanted thermal conductor 36 will, either spontaneously or with heat treatment, cause the metals in the organometallic dielectric to combine with the implanted metal ions to form a substantially coherent and continuous metal interconnect.

Combination of the metals in the organometallic and the implanted species accomplishes more metallization in implanted interconnect 30 or in an implanted thermal conductor 36 than simple implantation alone achieves. The combination also renders the organometallic dielectric more resistant to electrical conductivity than regions not implanted with metal ions.

The capabilities of a beam current implanter device being for used ion implantation will determine an optimized implant time. The thickness of the dielectric layer will also determine implant time. If the dielectric layer in the above-given example were 5,000 angstroms, the first implant would not be required and the total implant time would be 51 percent less than that required for a 10,000 angstrom dielectric layer. For a 2,500 angstrom dielectric layer, the first two implants would not be required and implant time would be reduced to 20 percent of implant time required for a 10,000 angstrom dielectric layer.

In the case of a 10,000 angstrom dielectric layer that is situated over an electrically conductive region, the minimum size contact which could be made is dependent upon the scatter of the ion implant species, and the size of the minimum photo-definable image. For example, if the minimum definable image were 0.25 microns with a tolerance of ±0.05 micron, the radial range of the most energetic implant would be added to the photolithographic tolerance to determine the appropriate minimum contact size. In the case of an implant of about 825 KeV, the minimum size would be approximately 0.14 microns, giving a total minimum contact size of approximately 0.44 microns. For a 4,500 angstrom film where maximum implant energy would be about 410 KeV, the radial range is approximately 0.075 microns, and results in a minimum effective contact size of about 0.38 micron. For a 2,500 angstrom film where maximum implant energy is about 175 KeV, the radial range is about 0.35 microns and results in a minimum contact size of about 0.34 microns.

The present invention may be embodied in other specific forms without departing from its spirit or essential characteristics. The described embodiments are to be considered in all respects only as illustrated and not restrictive. The scope of the invention is, therefore indicated by the appended claims and their combination in whole or in part rather than by the foregoing description. All changes that come within the meaning and range of equivalency of the claims are to be embraced within their scope.

What is claimed and desired to be secured by United States Letters Patent is:

1. A method of altering electrical and thermal conductivity comprising:

providing a dielectric material that is on and in contact with a semiconductor substrate, implanting ions into the dielectric material to form an implanted region that has higher electrical and thermal conductivities with respect to those of the non-implanted dielectric material, said implanted region forming an electrically conductive structure in the dielectric material; wherein said implanted region is not in electrical communication with the semiconductor substrate and is electrically isolated by the dielectric material.

2. The method as defined in claim 1, wherein:

the dielectric material is selected from a group consisting of at least one of BPSG, PSG, silica, thoria, ceria, and zirconia, organic, fluoro organic, and organometallic compounds PMDA-ODA, BPDA-ODA, BPDA-PDA, PMDA-ODA, BTDA-PDA, and BTDA-ODA; and said ions comprise at least one metal ion selected from the group consisting of Ni, Cr, Ta, W, Zr, Hf, and V ions.

3. A method as defined in claim 2, wherein said ions comprise at least one metal ion selected from the group consisting of Al, Ti, and Mo ions.

4. A method of forming an electrically conductive structure comprising:

providing a dielectric material having a dielectric material top surface, wherein the dielectric material is disposed on and in contact with a top surface of a semiconductor substrate at an interface; and implanting ions into the dielectric material and into the semiconductor substrate to form an electrically conductive structure, wherein:

the electrically conductive structure extends from the top surface of said semiconductor substrate to the dielectric material top surface;

said ions are implanted beneath the interface into an implantation region of said semiconductor substrate; and the electrically conductive structure further extends beneath said interface and the electrically conductive structure in the dielectric material and the electrically conductive structure in the semiconductor substrate are aligned with respect to each other.

5. A method as defined in claim 4, wherein said implantation region of said semiconductor substrate comprises an electrically active area.

6. A method of forming an electrically conductive structure, comprising:

providing a dielectric material disposed on and in contact with a semiconductor substrate at a dielectric material-semiconductor substrate interface;

bombarding the dielectric material with implantation ions to form an implanted electrically conductive region in the dielectric material; and reducing electrical resistance and reducing thermal stress at said interface by performing said bombarding at least until implantation ions are implanted into the semiconductor substrate to form an implanted region in the semiconductor substrate.

7. A method of forming an electrically conductive structure as defined in claim 6, wherein said ions comprise at least one metal ion selected from the group consisting of Al, Ti, and Mo ions.

8. The method as defined in claim 6, further comprising:

forming a patterned mask on the dielectric material to expose an area on a top surface of the dielectric material and to leave unexposed area on the top surface of said dielectric material; and bombarding the dielectric material by directing said ions into said exposed area on the top surface of the dielectric material, wherein the unexposed area on the top surface of said dielectric material is prevented from implantation by said ions by said patterned mask.

9. The method as defined in claim 8, further comprising forming an electrically conductive metal line on the top surface of the dielectric material and in contact with the implanted electrically conductive region.

10. A method of forming an structure according to claim 8, wherein said patterned mask comprises a composite structure comprising:

a first photoresist upon said dielectric material;

a nitride upon said first photoresist; and a second photoresist upon said nitride.

11. A method of forming an structure according to claim 10, wherein:

said first photoresist has a thickness from about 2,000 Å to about 8,000 Å;

said nitride has a thickness from about 2,000 Å to about 8,000 Å; and said second photoresist has a thickness from about 500 Å to about 3,500 Å.

12. The method as defined in claims 8, wherein the patterned mask comprises a photoresist; and further comprising:

removing said patterned mask from the dielectric material; and forming an electrically conductive metal line on the dielectric material and in contact with the electrically conductive structure.

13. A method as defined in claim 6, wherein the dielectric material is selected from a group consisting of at least one of BPSG, PSG, silica, thoria, ceria, zirconia, organic, fluoro organic, organometallic compounds, PMDA-ODA, BPDA-ODA, BPDA-PDA, PMDA-ODA, BTDA-PDA, and BTDA-ODA.

14. A method of forming an electrically conductive structure according to claim 6, wherein said ions comprise at least one metal ion selected from the group consisting of Ni, Cr, Ta, W, Zr, Hf, and V ions.

15. The method as defined in claim 6, further comprising increasing the electrical conductivity of the implanted electrically conductive region.

16. The method as defined in claim 15, wherein the electrical conductivity of the implanted electrically conductive region is increased by heat treatment.

17. A method as defined in claim 6, wherein:

said dielectric material has a thickness from about 2,000 Å to about 12,000 Å;

said implanted electrically conductive region has a width from about 0.3 Å to about 0.49 Å and a length from about 1,000 Å to about 30,000 Å.

18. A method as defined in claim 6, wherein said implanted electrically conductive region comprises a series of implantation regions, wherein each one of the series of implantation regions overlaps with contiguous implantation regions and wherein the series of implantation regions exhibits a non-uniform distribution of concentrations of implantation ions.

19. A method of forming an electrically conductive structure, comprising:

providing a dielectric material disposed on and in contact with a semiconductor substrate at a dielectric material-semiconductor substrate interface; and bombarding the dielectric material with implantation ions to form an implanted electrically conductive region in the dielectric material, wherein said implanted electrically conductive region is electrically insulated within the dielectric material.

20. A method as defined in claim 19, wherein the implanted electrically conductive region has a higher coefficient of thermal conductivity than the coefficient of thermal conductivity of the dielectric material.

21. A method of forming an electrically conductive structure, comprising:

providing a dielectric material that comprises an organometallic compound;

bombarding the dielectric material with implantation ions to form an implantation region in the dielectric material; and forming a metallization connection by combining implantation ions with metal from the organometallic compound.

22. A method as defined in claim 21, wherein the dielectric material further comprises a fluoro organic compound.

23. A method as defined in claim 21, wherein said forming a metallization connection further comprises heating said implanted region.

24. A method as defined in claim 21, wherein forming a metallization connection further comprises releasing metal from said organometallic compound by catalysis effectuated at least in part by the implantation ions.

25. A method as recited in claim 21, wherein the dielectric material is on and in contact with a semiconductor substrate at a dielectric material-semiconductor substrate interface, and further comprising reducing electrical resistance at said interface by performing said bombarding at least until implantation ions are implanted into the semiconductor substrate to form an implanted region in the semiconductor substrate.

26. A method as recited in claim 21, wherein the dielectric material is on and in contact with a semiconductor substrate at a dielectric material-semiconductor substrate interface, and further comprising reducing thermal stress at said interface by performing said bombarding at least until implantation ions are implanted into the semiconductor substrate to form an implanted region in the semiconductor substrate.

27. A method as recited in claim 21, wherein the dielectric material is on and in contact with a semiconductor substrate at a dielectric material-semiconductor substrate interface, and further comprising reducing thermal stress and reducing electrical resistance at said interface by performing said bombarding at least until implantation ions are implanted into the semiconductor substrate to form an implanted region in the semiconductor substrate.

28. A method as recited in claim 21, wherein the dielectric material is on and in contact with a semiconductor substrate at a dielectric material-semiconductor substrate interface, and further comprising forming a self-aligned active area in the semiconductor substrate by bombarding the dielectric material at least until implantation ions penetrate into the semiconductor substrate, and wherein the metallization connection in the dielectric material and the active area in the semiconductor substrate are self-aligned.

29. A method of forming an electrically conductive structure, comprising:

providing a dielectric material that comprises an organometallic dielectric, wherein the dielectric material is on and in contact with a semiconductor substrate at a dielectric material-semiconductor substrate interface;

bombarding the dielectric material with implantation ions to form an implanted region in the dielectric material;

forming a metallization connection by combining implantation ions with metal from the organometallic dielectric; and reducing electrical resistance and reducing thermal stress at the interface by performing the bombarding at least until implantation ions are implanted into the semiconductor substrate that is self-aligned with the implanted region in the dielectric material.

30. A method for forming an electrically conductive structure, comprising:

providing a dielectric material that comprises an organometallic dielectric, the dielectric material extending from a dielectric top surface to a dielectric bottom surface;

bombarding the dielectric material with implantation ions to form an implanted region in the dielectric material; and forming an implanted heat-management structure by combining implantation ions with metal from the organometallic dielectric, wherein the implanted heat management structure is comprised between the dielectric top and bottom surfaces and wherein the implanted heat management structure is electrically insulated within the dielectric material.

31. A method as defined in claim 30, wherein forming an implanted heat-management structure further comprises heating the implanted region.

32. A method as recited in claim 30, wherein forming an implanted heat-management structure further comprises releasing metal from said organometallic dielectric by catalysis effectuated at least in part by the implanted ions.

33. A method as recited in claim 30, wherein the implanted heat-management structure forms a conduit that leads to a heat sink structure.

34. A method of forming an electrically conductive structure, comprising:

providing a dielectric material that is disposed on and in contact with a semiconductor substrate at a dielectric material-semiconductor substrate interface;

forming an implanted region that comprises a series of contiguous implantation regions by bombarding the dielectric material with implantation ions, wherein each one of the series of implantation regions overlaps with the contiguous implantation regions, wherein the series of implantation regions exhibits a non-uniform distribution of concentrations of implantation ions, and wherein the non-uniform concentration of implantation ions comprises concentrations in the range from a maximum concentration to a minimum concentration, the minimum concentration being about on-third the maximum concentration; and reducing electrical resistance and reducing thermal stress at said interface by performing the bombarding at least until implantation ions are implanted into the semiconductor substrate to form an implanted region in the semiconductor substrate.

35. A method as recited in claim 34, wherein each one of the series of implantation regions overlaps with the contiguous implantation regions at overlap regions with an implantation ion concentration in each overlap region that is in the range from about 0% to about 10% of the implantation ion concentrations in the contiguous implantation regions that overlap at each overlap region.

36. A method as recited in claim 34, wherein implantation ions are implanted in each one of the series of implantation regions at an implantation dose of at least 30%.

37. A method as recited in claim 34, wherein the dielectric material comprises at least one organometallic compound, and further comprising forming a metallization connection by combining implantation ions with metal from the at least one organometallic compound, wherein the metallization connection has a higher coefficient of thermal conductivity than the coefficient of thermal conductivity of the dielectric material, and increasing the electrical conductivity of the metallization connection by heating the implanted region.

* * * * *

UNITED STATES PATENT AND TRADEMARK OFFICE
CERTIFICATE OF CORRECTION

PATENT NO. : 6,432,844 B1
DATED : August 13, 2002
INVENTOR(S) : Paul A. Farrar

It is certified that error appears in the above-identified patent and that said Letters Patent is hereby corrected as shown below:

<u>Column 3,</u>
Line 53, change "phenylenediamice" to -- phenylenediamine --

Signed and Sealed this

Twenty-fifth Day of February, 2003

JAMES E. ROGAN
*Director of the United States Patent and Trademark Office*